United States Patent [19]

Ecklund et al.

[11] Patent Number: 4,774,476

[45] Date of Patent: Sep. 27, 1988

[54] LINEARIZED DIFFERENTIAL AMPLIFIER

[75] Inventors: Lawrence M. Ecklund, Wheaton; Charles J. Marik, Richmond, both of Ill.

[73] Assignee: Motorola, Inc., Schaumburg, Ill.

[21] Appl. No.: 69,920

[22] Filed: Jul. 6, 1987

[51] Int. Cl.[4] .............................................. H03F 3/45
[52] U.S. Cl. .................................... 330/260; 330/261
[58] Field of Search ............... 330/103, 259, 260, 261, 330/291

[56] References Cited

U.S. PATENT DOCUMENTS 4,710,727  12/1987  Rutt ..................................... 330/103

Primary Examiner—Gene Wan
Attorney, Agent, or Firm—Steven G. Parmelee

[57] ABSTRACT

A linearized differential amplifier having two feedback paths. One of the feedback paths functions to linearize the output of the differential amplifier. The remaining feedback path functions to slightly limit the operating range of the differential amplifier to ensure the operational stability of the differential amplifier.

1 Claim, 2 Drawing Sheets

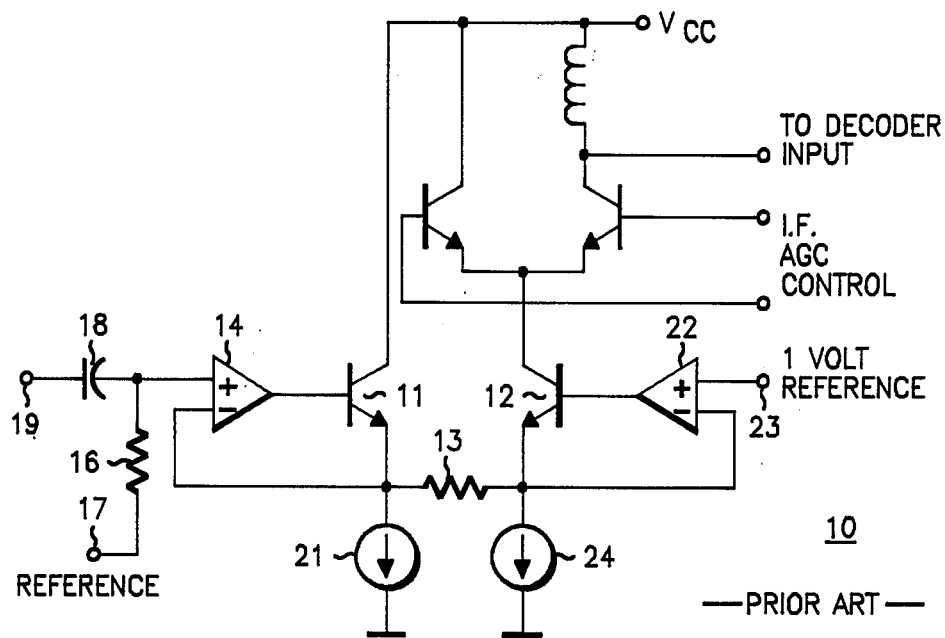
FIG. 1 —PRIOR ART—
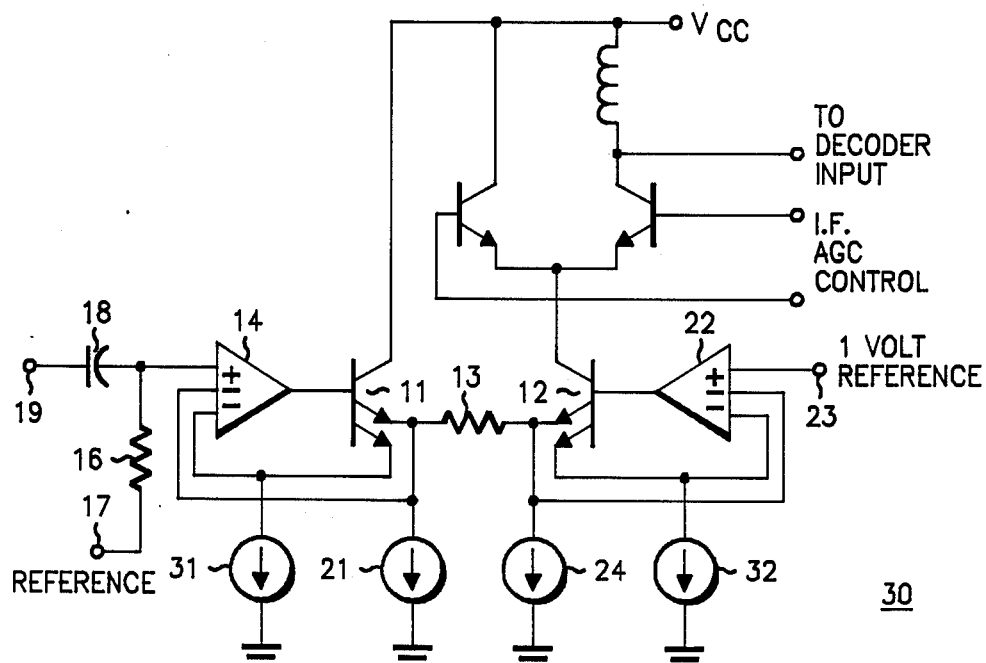
FIG. 2

LINEARIZED DIFFERENTIAL AMPLIFIER

TECHNICAL FIELD

This invention relates generally to differential amplifiers, and particularly to apparatus and methods for the stabilized linearization of the output of the differential amplifier with respect to its input.

BACKGROUND ART

Differential amplifiers are well known in the art. Such devices typically include an input for receiving an input signal, a reference input for receiving a reference signal, and an output for providing an output signal that is related to a difference comparison between the input signal and the reference signal. With reference to FIG. 3 of the drawings, this output comprises something of an imperfect linear response as depicted in phantom lines by the reference numeral 101.

The applicant herein previously invented a device for more substantially linearizing the above response. With reference to FIG. 1, this previous invention can be seen as depicted generally by the numeral 10. This device (10) included a differential amplifier made up of a first transistor (11), a second transistor (12), and a coupling resistor (13). The base of the first transistor (11) connected to the output of an amplifier (14), the non-inverting input of which connects through a biasing resistor (16) to a reference (17) and also through a coupling capacitor (18) to an input (19) for receiving an input signal. The inverting input of the amplifier (14) connects to the emitter of the first transistor (11) and to a first large current source (21).

The second transistor (12) connects to the output of a second amplifier (22), the noninverting input of which connects to a reference (23) and the inverting input of which connects to the emitter of the second transistor (12) and to a second large current source (24).

So configured, negative feedback will be provided for each transistor (11 and 12), such that the output of the differential amplifier will be substantially linearized. With reference to FIG. 3 again, the linearized output can be represented in solid lines as depicted by the reference numeral 102.

A problem exists, however, with this prior approach of the Applicant. In particular, at the extremes of the operating range of the linearized approach (102), negative feedback current terminates. This, particularly when considered in conjunction with the coupling resistance (13) between the two transistors (11 and 12), leads to instabilities that can create unusual and undesired oscillation modes which can detrimentally impact the performance of the differential amplifier. There therefore exists a need for a means of linearizing a differential amplifier response while simultaneously ensuring stable performance for various input signal amplitudes.

SUMMARY OF THE INVENTION

These needs and others are met through provision of the linearized differential amplifier disclosed herein. This device includes a differential amplifier having an input for receiving an input signal, a reference input for receiving a reference signal, and an output for providing an output signal that is related to the difference between the input signal and the reference signal. The device also includes a first feedback path that functions to substantially linearize the output signal with respect to the input signal, and a second feedback path that functions to effectively restrict the operating range of the differential amplifier to ensure that the differential amplifier remains stable.

In the embodiment set forth below, the second feedback path includes a small feedback current that is not resistively coupled to the opposing transistor, such that this small feedback current will always be present for each transistor, regardless of the amplitude of the incoming signal. As a result, feedback current will never be less than this small amount, and the differential amplifier will never be allowed to reach an unstable condition.

BRIEF DESCRIPTION OF THE DRAWINGS

These and other attributes of the invention will become more clear upon making a thorough review and study of the following description of the best mode for carrying out the invention, wherein:

FIG. 1 comprises a depiction of the Applicant's prior art device;

FIG. 2 comprises a schematic diagram of the invention;

BEST MODE FOR CARRYING OUT THE INVENTION

Figure 3:
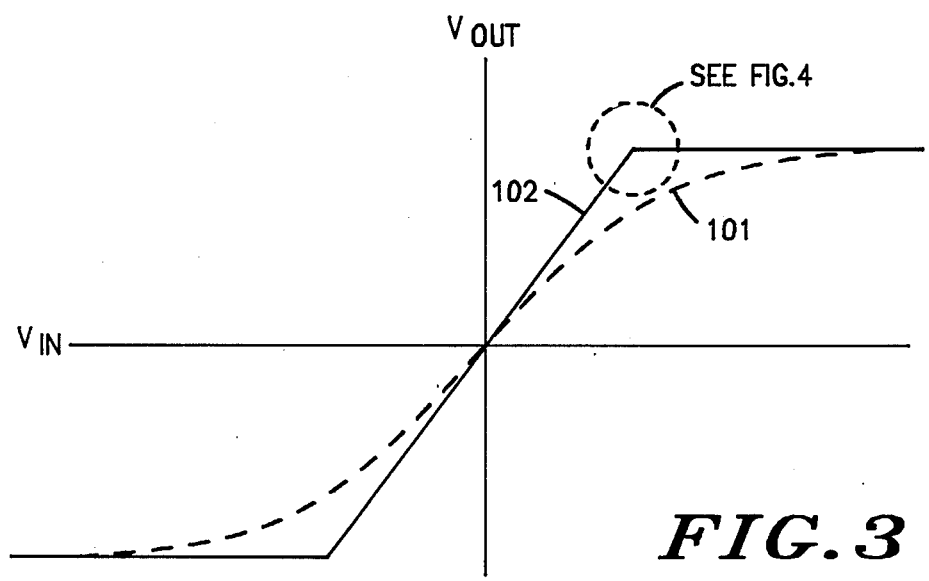
FIG. 3 comprises a graph depicting $V_{out}$ versus $V_{in}$ for the invention.

Referring now to the drawings, and in particular to FIG. 2, the invention can be seen as depicted generally by the numeral 30. The invention (30) includes the same components identified above with respect to FIG. 1, which identical components are referred to in FIG. 2 by the same corresponding reference numerals.

In addition, however, both of the amplifiers (14 and 22) each include an additional inverting input, and each transistor (11 and 12) each includes an additional emitter. The additional emitter of the first transistor (11) couples to the additional inverting input of its corresponding amplifier (14) and also to a small current source (31). In a similar manner, the second transistor (12) couples to its corresponding amplifier (22) and to a second small current source (32).

So configured, this second feedback path for each transistor will always allow at least a minimum level of negative feedback current to flow, such that, regardless of the amplitude or form of the incoming signal at the input (19), there will always be at least this small amount of feedback current. Consequently, the range of the differential amplifiers transfer function will be reduced by an amount commensurate with the amount of feedback. As a result, though the operating range of the differential amplifier will be slightly diminished, the stability of the differential amplifier will be greatly enhanced.

Figure 4:
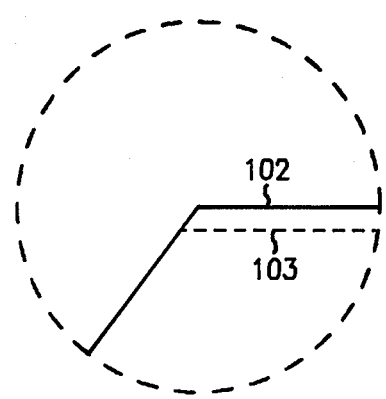
FIG. 4 comprises a detail depiction of the FIG. 3 graph.

With reference to FIG. 4, the slightly restricted operating range of the stabilized differential amplifier can be seen to result due to a slight movement of the differential amplifier response from the upper phantom line (102) to the lower line (103). In a similar way, of course, the operating range is restricted at the lower left hand quadrant of FIG. 3 as well.

The above discussion presumes, of course, a total finite availability of current; i.e., that the maximum possible current flow through the single current source (21 or 24) equals the combined maximum possible current flow through the two current sources ( 21 and 31 or 24 and 32). Because of this limitation on total available current, the small amount of feedback current urged by the small current source (31 or 32) must always come at the expense of the total current available to flow with respect to the large current source (21 or 24). Depending upon the needs of a particular application, it may be appropriate to provide increased current flow capabilities to thereby retain the full range of the differential amplifier. This could be accomplished, for example, by using two transistors in place of one transistor having two emitters, wherein the current contribution of each transistor could be made independent of one another such that the large current sources (21 and 24) would function with the same maximum amount of current regardless of the inclusion or exclusion of the small current sources (31 and 32). In either case, the primary contribution of the invention, avoidance of undesirable oscillations while maintaining linearity, will be attained.

Through provision of this invention, substantially all of the benefits of the linearized differential amplifier can be attained without the stability problems inherent to the previous design. Those skilled in the art will appreciate that various modifications can be made to this inventive concept without departing from the spirit and scope of the invention itself, and therefore the claims are not to be considered as being limited to the precise embodiment set forth in the absence of specific limitations directed to such embodiments.

We claim:
1. A linearized differential amplifier comprising:
    first and second transistors, wherein each of said transistors includes at least two emitters and a base;
    first and second amplifiers, wherein a first one of said amplifiers has a non-inverting input for connecting to receive an input signal and at least two inverting inputs, and wherein a second one of said amplifiers includes a non-inverting input for receiving a reference signal and at least two inverting inputs;
    a resistor coupled between a first one of said at least two emitters of said first transistor and said second transistor;
    a first feedback path connecting said first emitter of said first transistor to one of said inverting inputs of said first amplifier;
    a second feedback path wherein said first emitter of said second transistor couples to an inverting input of said second amplifier;
    a third feedback path wherein said second emitter of said first transistor connects to another inverting input of said first amplifier;
    a fourth feedback path wherein said second emitter of said second transistor couples to another inverting input of said second amplifier;
    wherein said first feedback path couples to a first current source; and
    said third feedback path couples to a second current source, wherein said second current source is smaller than said first current source; and
    wherein said second feedback path couples to a third current source and said fourth feedback path couples to a fourth current source, wherein said fourth current source is smaller than said third current source.

* * * * *